United States Patent [19]

Ettenberg

[11] 3,821,039

[45] June 28, 1974

[54] METHOD OF EPITAXIALLY DEPOSITING A SEMICONDUCTOR MATERIAL ON A SUBSTRATE

[75] Inventor: Michael Ettenberg, Freehold, N.J.

[73] Assignee: RCA Corporation, New York, N.Y.

[22] Filed: Mar. 22, 1973

[21] Appl. No.: 343,911

[52] U.S. Cl. .................. 148/171, 148/172, 148/1.5, 252/62.3 GA, 117/201

[51] Int. Cl. .............................................. H01l 7/38

[58] Field of Search ............................ 148/171-173, 148/1.5; 252/62.3 GA

[56] References Cited

UNITED STATES PATENTS

| | | | |
|---|---|---|---|
| 3,475,661 | 10/1969 | Iwata et al. | 317/234 R |
| 3,560,276 | 2/1971 | Panish et al. | 148/171 |
| 3,687,743 | 8/1972 | Le Duc | 148/171 |
| 3,696,262 | 10/1972 | Antypas | 148/171 X |

OTHER PUBLICATIONS

J. Electrochem. Soc., Solid State Science, Nov. 1968, pp. 1184–1190.

J. Materials Science, Vol. 4, (1969), pp. 223–235.

*Primary Examiner*—George T. Ozaki
*Attorney, Agent, or Firm*—Glenn H. Bruestle; Donald S. Cohen

[57] ABSTRACT

In epitaxially depositing a layer of a single crystalline semiconductor material on a substrate by liquid phase epitaxy where there is a relatively large lattice mismatch between the semiconductor material and the material of the substrate, the semiconductor layer is deposited on a roughened surface of the substrate.

5 Claims, 3 Drawing Figures

METHOD OF EPITAXIALLY DEPOSITING A SEMICONDUCTOR MATERIAL ON A SUBSTRATE

BACKGROUND OF THE INVENTION

The present invention relates to a method of epitaxially depositing a substantially uniform layer of a single crystalline semiconductor material on a substrate where there is a relatively large lattice mismatch between the semiconductor material and the material of the substrate.

Epitaxial layers of a single crystalline semiconductor material have been deposited on a crystalline substrate by bringing a surface of the substrate into contact with a solution of a semiconductor material dissolved in a molten metal solvent; cooling the solution so that a portion of the semiconductor material in the solution precipitates and deposits on the substrate as an epitaxial layer; and then removing the substrate from the solution. This method is known as "liquid phase epitaxy." Liquid phase epitaxy has been particularly useful for depositing epitaxial layers of the group III-V compounds, such as the nitrides, phosphides, arsenides and antimonides of boron, aluminum, gallium and indium and mixtures and combinations thereof.

Heretofore, it has been the practice to polish the surface of the substrate on which the epitaxial layer is to be deposited. The substrate surface is polished to remove any crystalline damages at the surface so that the epitaxial layer deposited on the surface of the substrate will be substantially free of crystalline dislocations. However, it has been found that when the semiconductor material being deposited has a crystalline lattice which is substantially different from the crystalline lattice of the material of the substrate, a difference greater than about 0.3 percent, it is very difficult to deposit by liquid phase epitaxy a uniform layer of the semiconductor material over the entire polished surface of the substrate. It is believed that this results from the fact that the relatively large lattice mismatch between the semiconductor material and the material of the substrate prevents uniform nucleation over the entire polished surface of the substrate.

SUMMARY OF THE INVENTION

An epitaxial layer of a semiconductor material is deposited on a substrate by first roughening the surface of the substrate. The roughened surface of the substrate is then placed into contact with a solution containing the semiconductor material. The solution is cooled to deposit some of the semiconductor material from the solution onto the roughened surface of the substrate to form the epitaxial layer. The substrate with the layer thereon is then separated from the solution.

DETAILED DESCRIPTION

Figure 1:
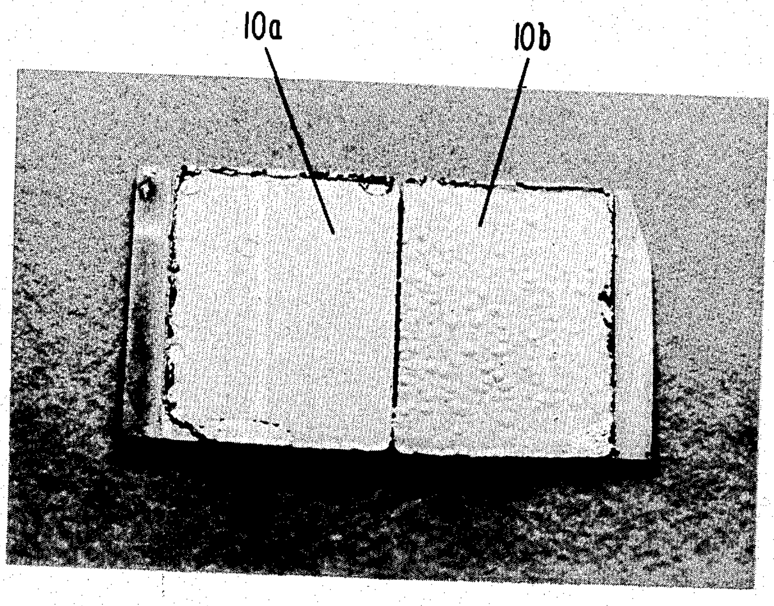
FIG. 1 is a photomicrograph of the top surface of two identical semiconductor devices, one made by the method of the present invention and the other by the prior art method.

I have found that an epitaxial layer of a single crystalline semiconductor can be deposited by liquid phase epitaxy uniformly over the surface of a substrate of a crystalline material having a crystalline lattice substantially different from the crystalline lattice of the semiconductor material by depositing the epitaxial layer on a roughened surface of the substrate. By a roughened surface it is meant that the surface has been roughened sufficiently to introduce crystalline dislocations or work damage near the surface but does not cause a substantial non-uniformity in the general planarity of the surface. The deposition of the epitaxial layer on a roughened surface of the substrate is most suitable when the lattice mismatch between the material of the substrate and the semiconductor material is greater than about 0.3 percent. Some pairs of materials which have lattice mismatches greater than about 0.3 percent and at least one of which can be deposited by liquid phase epitaxy are as follows:

| | |
|---|---|
| Gallium Arsenide ($GaAs$) | Gallium Phosphide ($GaP$) |
| Indium Gallium Arsenide ($In_xGa_{1-x}As$ where $x > .05$) | Gallium Arsenide ($GaAs$) |
| Indium Arsenide Phosphide ($InAs_xP_{1-x}$ where $x > .1$) | Indium Phosphide ($InP$) |
| Aluminum Gallium Arsenide ($Al_xGa_{1-x}As$ where $0 \leq x \leq 1$) | Gallium Phosphide ($GaP$) |

It is believed that a substantially smooth and uniform epitaxial layer of the semiconductor material can be deposited over the entire roughened surface of the substrate, which cannot be achieved on a polished surface, because the roughened surface provides an increased number of nucleation sites to allow growth of the single crystalline epitaxial layer over the entire surface of the substrate. Although the roughened surface of the substrate tends to create crystalline dislocations in the deposited epitaxial layer, this is not detrimental since the relatively large lattice mismatch between the semiconductor material and the material of the substrate also tends to create such crystalline dislocations.

To carry out the method of the present invention, the surface of the substrate may be roughened by any well known technique, such as by rubbing with sand paper or any other type of hard particles or with a sand blast. The semiconductor layer is then deposited on the roughened surface of the substrate by liquid phase epitaxy. In general, this is achieved by placing in separate locations in a furnace boat the substrate and a charge of the semiconductor material and a solvent for the semiconductor material. The furnace boat and its contents are then placed in a furnace and heated to a temperature at which the solvent is molten and the semiconductor material dissolves in the molten solvent to provide a solution of the semiconductor material in the molten solvent. The roughened surface of the substrate is then brought into contact with the solution and the furnace boat and its contents are then cooled. Cooling the solution causes some of the semiconductor material to precipitate out of the solution and deposit on the roughened surface as an epitaxial layer of the semiconductor material. When an epitaxial layer of a desired thickness has been deposited on the substrate, the substrate is separated from the remaining solution. Suitable apparatus for carrying out the epitaxial deposition are shown and described in U.S. Pat. No. 3,158,512 to H. Nelson et al., issued Nov. 24, 1964, entitled "Semiconductor Device and Methods of Making Them," and in U.S. Pat. No. 3,565,702, to H. Nelson, issued Feb. 23, 1971, entitled "Depositing Successive Epitaxial Semiconductor Layers From The Liquid Phase."

Figure 2:
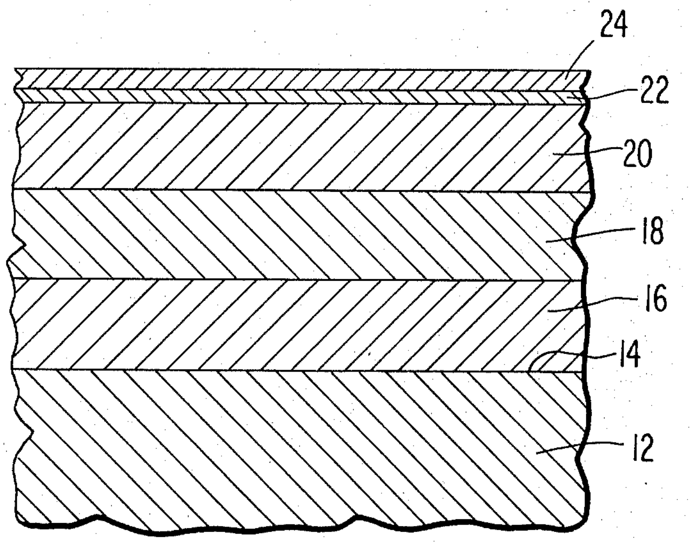
FIG. 2 is a cross-sectional view of each of the devices shown in FIG. 1.

FIG. 1 is a photomicrograph of the top surfaces of two semiconductor devices 10*a* and 10*b* in side-by-side relation. The two semiconductor devices 10*a* and 10*b* are identical in construction except that the semiconductor device 10*a* is made with a substrate having a roughened surface in accordance with the present invention and semiconductor device 10*b* is made with a substrate having a smooth, polished surface in accordance with the previously used methods. As shown in FIG. 2, each of the semiconductor devices 10*a* and 10*b* comprises a flat substrate 12 of single crystalline gallium phosphide (GaP) having on a surface 14 thereof a first epitaxial layer 16 of aluminum gallium arsenide ($Al_xGa_{1-x}As$ where $x \approx 0.3$). As previously stated, the surface 14 of the substrate 12 of the semiconductor device 10*a* is roughened whereas the surface 14 of the substrate 12 of the semiconductor device 10*b* is polished smooth. On the first epitaxial layer 16 is a second epitaxial layer 18 of aluminum gallium arsenide ($Al_xGa_{1-x}As$), and on the second epitaxial layer 18 is a third epitaxial layer 20 of aluminum gallium arsenide ($Al_xGa_{1-x}As$) doped with zinc. On the third epitaxial layer 20 is a fourth epitaxial layer 22 of gallium arsenide (GaAs) doped with germanium, and on the fourth epitaxial layer 22 is a fifth epitaxial layer 24 of gallium arsenide (GaAs) doped with germanium. The first, second and third epitaxial layers 16, 18, and 20 are each about 10 microns in thickness, the fourth epitaxial layer 22 is about ½ micron in thickness and the fifth epitaxial layer 24 is about one micron in thickness.

The semiconductor devices were made by starting with a flat wafer of gallium phosphide having both flat surfaces polished smooth. The wafer was cut in half to provide the substrates of the two devices. A surface of one of the substrates was roughened by lapping the surface with an abrasive. The two substrates were then chemically cleaned and mounted in side-by-side relation with the roughened surface of the one substrate and a polished surface of the other substrate facing upwardly for deposition. The epitaxial layers of the devices were then simultaneously deposited on both of the substrates by liquid phase epitaxy.

Figure 3:
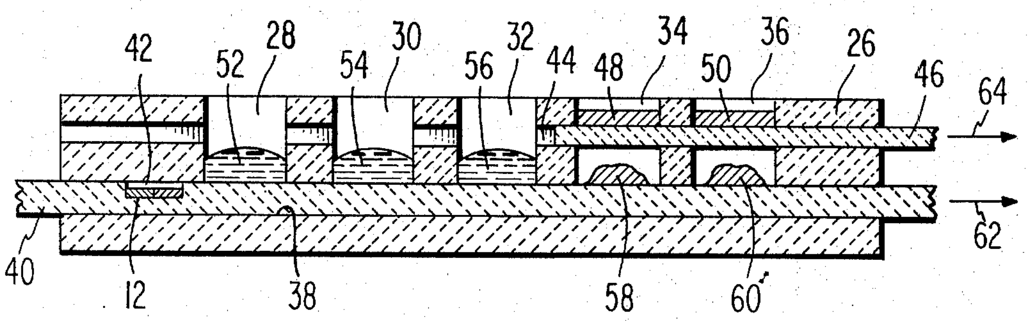
FIG. 3 is a sectional view of an apparatus in which each of the devices shown in FIG. 1 was made.

The epitaxial layers were deposited on the substrates using a deposition furnace boat of the construction shown in FIG. 3. The furnace boat 26 is made of a refractory material, such as graphite, and has five spaced wells 28, 30, 32, 34, and 36 in its upper surface. A first passage 38 extends longitudinally through the boat 26 from one end to the other and crosses the bottoms of the wells. A first slide 40 slidably extends through the first passage 38 so that the top surface of the first slide becomes the bottom surface of the wells. The first slide 40 is of a refractory material, such as graphite, and has a recess 42 in its upper surface in which the substrates 12 are seated. A second passage 44 extends longitudinally through the boat 26 and crosses the wells above and spaced from the first passage 38. A second slide 46 extends through the second passage 44.

To deposit the epitaxial layers on the substrates, a charge was placed in each of the wells 28, 30, 32, 34, and 36 of the furnace boat 26. The first charge in the first well 28 included 2 grams gallium, 0.157 gram gallium arsenide, and 4 milligrams aluminum. The second charge in the second well 30 included 2 grams gallium, 0.126 gram gallium arsenide and 3.5 milligrams of aluminum. The third charge in the third well 32 included 2 grams gallium, 0.102 gram gallium arsenide, 3 milligrams aluminum and 3 milligrams zinc. The fourth and fifth charges in the fourth and fifth wells 34 and 36 each included 1 gram gallium and 0.1 gram germanium. The second slide 46 was placed in the passage 44 and over the fourth and fifth wells 34 and 36 as shown in FIG. 2. Separate source wafers 48 and 50 of gallium arsenide were placed on the second slide 46 in each of the fourth and fifth wells 34 and 36. The substrates 12 were seated in side-by-side relation in the recess 42 in the first slide 40 and positioned adjacent the first well 28.

The furnace boat 26 and its contents were placed in a furnace tube, and with a flow of hydrogen through the furnace tube and over the boat the furnace tube was heated to about 915°C. At this temperature the gallium in each of the charges in the wells of the boat was molten and the other ingredients of each of the charges dissolved in the molten gallium. Thus, the charges in the first, second and third wells 28, 30, and 32 became first, second and third solutions 52, 54, and 56, respectively, of gallium arsenide and aluminum dissolved in molten gallium. The third solution 56 also had zinc dissolved therein. The charges in the fourth and fifth wells 34 and 36 became fourth and fifth solutions 58 and 60 of germanium dissolved in molten gallium. The furnace tube was held at 915°C long enough to insure complete homogenization of the solutions, about 10 minutes.

The temperature of the furnace tube was then lowered to about 900°C and held at this temperature for about 5 minutes to insure that the furnace boat and its contents were at this lower temperature. The first slide 40 was then moved in the direction of the arrow 62 in FIG. 3 to move the substrates 12 into the first well 28 where the surface of the substrates were brought into contact with the first solution 52. The temperature of the furnace tube was then raised about 3° to melt back some of the material of the substrates 12 into the first solution 52. The temperature of the furnace tube was then slowly lowered to cool the furnace boat 26 and its contents at a rate of about 1° per minute. As the first solution 52 cooled, some of the gallium arsenide in the solution precipitated out of the first solution and deposited on the surfaces of the two substrates to form the first epitaxial layer 16. Some of the aluminum in the first solution 52 became incorporated in the first epitaxial layer 16, replacing some of the gallium so that the first epitaxial layer 16 was of aluminum gallium arsenide.

After the temperature in the furnace tube dropped about 20°, the first slide 40 was again moved in the direction of the arrow 62 to move the substrate 12 with the first epitaxial layer 16 thereon from the first well 28 to the second well 30. This brought the first epitaxial layer 16 into contact with the second solution 54. The cooling of the furnace boat 26 and its contents was continued at the rate of about 1° per minute to precipitate out of the second solution some of the gallium arsenide and aluminum and deposit on the first epitaxial layer 16 the second epitaxial layer 18 of aluminum gallium arsenide.

When the temperature in the furnace tube dropped about 20°, the first slide 40 was again moved in the direction of the arrow 62 to move the substrate 12 with the first and second epitaxial layers 16 and 18 thereon from the second well 30 to the third well 32. This brought the second epitaxial layer 18 into contact with the third solution 56. The furnace boat and its contents were further cooled to precipitate from the third solution 56 some of the gallium arsenide and aluminum and deposit on the second epitaxial layer 18 the third epitaxial layer 20 of aluminum gallium arsenide. Some of the zinc in the third solution 56 becomes incorporated in the lattice of the third epitaxial layer 20 so as to provide a P type conductivity third epitaxial layer. To deposit the third epitaxial layer 20, the furnace boat and its contents were first cooled at a rate of 1° per minute for a drop of 7°, then at ½° per minute for a drop of 4°, then at 1/4° per minute for a drop of 6° and then at 1/10° per minute for a drop of 2°.

During the last portion of the deposition of the third epitaxial layer 20, i.e., when the cooling rate was lowered to 1/10° per minute, the second slide 46 was moved in the direction of arrow 64 in FIG. 3 to allow the gallium arsenide source wafers 48 and 50 to drop into their respective wells onto the fourth and fifth solutions 58 and 60, respectively. Some of the gallium arsenide from the source wafers 48 and 50 dissolved in their respective solutions 58 and 60 so that the solution contained therein gallium arsenide as well as the germanium. When the deposition of the third epitaxial layer 20 was completed, the first slide 40 was again moved in the direction of the arrow 62 to move the substrate 12 with the three epitaxial layers thereon from the third well 32 into the fourth well 34 where the third epitaxial layer 20 was brought into contact with the fourth solution 58. At the same time, the cooling of the furnace boat and its contents was discontinued and the furnace tube was maintained at its then temperature for about 10 minutes to allow the fourth solution 58 to become saturated with the gallium arsenide from the source wafer 48. The cooling of the furnace boat 26 and its contents was continued again at a rate of about 1° per minute. This caused some of the gallium arsenide in the fourth solution 58 to precipitate out of the solution and deposit on the third epitaxial layer 20 to form the fourth epitaxial layer 22 of gallium arsenide. Some of the germanium in the fourth solution 58 became incorporated in the lattice of the fourth epitaxial layer 22 to provide P type conductivity gallium arsenide epitaxial layers.

When the temperature in the furnace tube dropped one degree, the first slide 40 was again moved in he direction of the arrow 62 to move the substrate 12 with the four epitaxial layers thereon from the fourth well 34 into the fifth well 36. This brought the fourth epitaxial layer 22 into contact with the fifth solution 60. The cooling of the furnace boat 26 and its contents was continued at a rate of 1° per minute. This caused some of the gallium arsenide in the fifth solution 60 to precipitate out of the solution and deposit on the fourth epitaxial layer 22 to form the fifth epitaxial layer 24 of gallium arsenide. Some of the germanium in the fifth solution 60 became incorporated in the lattice of the fifth epitaxial layer 24 to provide P type conductivity gallium arsenide epitaxial layers. After the furnace tube cooled about 3°, the first slide 40 was again moved in the direction of the arrow 62 to move the substrate with the five epitaxial layers thereon out of the fifth well. The furnace boat 26 and its contents were then removed from the furnace tube and the devices **10*a* and 10*b* were removed from the recess 42 in the first slide 40**.

Thus, the two devices **10*a* and 10*b* were simultaneously formed and each included an epitaxial layer of aluminum gallium arsenide deposited on a surface of a gallium phosphide substrate. For the device 10*a* the aluminum gallium arsenide epitaxial layer was deposited on a roughened surface of the gallium phosphide substrate in accordance with the present invention, whereas for the device 10*b***, the aluminum gallium arsenide epitaxial layer was deposited on a smooth, polished surface of the gallium phosphide substrate in accordance with the prior used techniques. As previously stated, aluminum gallium arsenide and gallium phosphide have a lattice mismatch of greater than about 0.3 percent.

As shown in the photomicrograph of FIG. 1, the top surface of the epitaxial layer of the device **10*a* is smooth, whereas the top surface of the epitaxial layer of the device 10*b* has bumps therein. The smooth surface of the device 10*a* indicates that the epitaxial layers are uniformly deposited on the substrate, whereas the bumps on the surface of the device 10*b*** indicate that the epitaxial layers are not as uniformly deposited on the substrate. Thus, it can be seen that when an epitaxial layer is deposited on a substrate and the materials of the epitaxial layer and the substrate have a lattice mismatch of greater than 0.3 percent, a uniform epitaxial layer can be achieved by roughening the surface of the substrate in accordance with the present invention which uniformity is not achieved on a smooth polished surface of the substrate.

I claim:

1. A method of depositing a layer of a semiconductor material on a substrate comprising the steps of roughening a surface of the substrate, placing the roughened surface of the substrate in contact with a solution of the semiconductor material dissolved in a molten solvent, cooling the solution to deposit some of the semiconductor material from the solution onto the roughened surface of the substrate, and separating the substrate with the layer of the semiconductor material thereon from the solution.

2. The method in accordance with claim 1 in which the semiconductor material has a lattice substantially different from the lattice of the substrate.

3. The method in accordance with claim 2 in which the lattice mismatch between the semiconductor material and the substrate is greater than 0.3 percent.

4. The method in accordance with claim 3 in which the surface of the substrate is roughened sufficiently to introduce crystalline dislocation or work damage near the surface but not enough to cause a substantial non-uniformity in the general planarity of the surface.

5. A method of making a semiconductor device having an epitaxial layer of a single crystalline semiconductor material on a substrate wherein there is a substantial lattice mismatch between the materials of the layer and the substrate comprising the steps of roughening a surface of the substrate, and epitaxially depositing the semiconductor material on said roughened surface of the substrate to form said layer.

* * * * *